United States Patent
Jan et al.

(10) Patent No.: US 11,930,716 B2
(45) Date of Patent: Mar. 12, 2024

(54) REDUCTION OF CAPPING LAYER RESISTANCE AREA PRODUCT FOR MAGNETIC DEVICE APPLICATIONS

(71) Applicant: Taiwan Semiconductor Manufacturing Company, Ltd., Hsinchu (TW)

(72) Inventors: Guenole Jan, San Jose, CA (US); Ru-Ying Tong, Los Gatos, CA (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 172 days.

(21) Appl. No.: 17/340,780

(22) Filed: Jun. 7, 2021

(65) Prior Publication Data

US 2021/0367146 A1    Nov. 25, 2021

Related U.S. Application Data

(60) Continuation of application No. 16/429,163, filed on Jun. 3, 2019, now Pat. No. 11,031,547, which is a
(Continued)

(51) Int. Cl.
*H01L 43/12*   (2006.01)
*H01F 10/32*   (2006.01)
(Continued)

(52) U.S. Cl.
CPC ......... *H10N 50/01* (2023.02); *H01F 10/3286* (2013.01); *H01F 41/308* (2013.01);
(Continued)

(58) Field of Classification Search
CPC ....... H01L 43/02; H01L 27/228; H01L 43/08; H01L 43/10; H01L 43/12; H01L 27/222;
(Continued)

(56) References Cited

U.S. PATENT DOCUMENTS 7,602,033 B2   10/2009   Zhao et al.
7,750,421 B2   7/2010    Horng et al.
(Continued)

OTHER PUBLICATIONS

PCT Search Report, PCT/US2013/034003 dated Jul. 2, 2013.
(Continued)

*Primary Examiner* — Younes Boulghassoul
*Assistant Examiner* — Quinton A Brasfield
(74) *Attorney, Agent, or Firm* — HAYNES AND BOONE, LLP

(57) ABSTRACT

A ferromagnetic layer is capped with a metallic oxide (or nitride) layer that provides a perpendicular-to-plane magnetic anisotropy to the layer. The surface of the ferromagnetic layer is treated with a plasma to prevent diffusion of oxygen (or nitrogen) into the layer interior. An exemplary metallic oxide layer is formed as a layer of metallic Mg that is plasma treated to reduce its grain size and enhance the diffusivity of oxygen into its interior. Then the plasma treated Mg layer is naturally oxidized and, optionally, is again plasma treated to reduce its thickness and remove the oxygen rich upper surface.

20 Claims, 6 Drawing Sheets

Related U.S. Application Data division of application No. 13/441,158, filed on Apr. 6, 2012, now Pat. No. 10,312,433.

(51) Int. Cl.
  *H01F 41/30* (2006.01)
  *H10N 50/01* (2023.01)
  *H10N 50/10* (2023.01)
  *G11C 11/16* (2006.01)

(52) U.S. Cl.
  CPC ............ *H10N 50/10* (2023.02); *G11C 11/161* (2013.01); *H01F 10/329* (2013.01)

(58) Field of Classification Search
  CPC ............... C11C 11/161; H01F 10/3286; H01F 10/3254; H01F 10/3236; H01F 41/303; H01F 41/307
  See application file for complete search history.

(56) References Cited

U.S. PATENT DOCUMENTS

| | | | |
|---|---|---|---|
| 8,048,492 B2 | 11/2011 | Fukuzawa et al. | |
| 8,592,927 B2 | 11/2013 | Jan et al. | |
| 9,006,704 B2 | 4/2015 | Jan et al. | |
| 10,312,433 B2 | 6/2019 | Jan et al. | |
| 2001/0055852 A1 | 12/2001 | Moise et al. | |
| 2002/0126425 A1 | 9/2002 | Balamane et al. | |
| 2002/0131202 A1 | 9/2002 | Westwood | |
| 2004/0183091 A1* | 9/2004 | Hibino | C23C 14/081 257/104 |
| 2004/0264070 A1* | 12/2004 | Lee | G11B 5/3903 |
| 2005/0254286 A1* | 11/2005 | Valet | G11C 11/16 365/158 |
| 2007/0015293 A1* | 1/2007 | Wang | B82Y 40/00 257/E43.006 |
| 2009/0122450 A1 | 5/2009 | Wang et al. | |
| 2010/0096716 A1 | 4/2010 | Ranjan et al. | |
| 2010/0258889 A1 | 10/2010 | Horng et al. | |
| 2010/0261295 A1* | 10/2010 | Horng | B82Y 40/00 257/E21.665 |
| 2011/0086439 A1 | 4/2011 | Choi | |
| 2011/0096443 A1 | 4/2011 | Zhang et al. | |
| 2011/0164335 A1 | 7/2011 | Xue et al. | |
| 2012/0056285 A1 | 3/2012 | Bessho et al. | |
| 2012/0068284 A1 | 3/2012 | Kitagawa et al. | |
| 2012/0128870 A1 | 5/2012 | Zhao et al. | |
| 2012/0205757 A1* | 8/2012 | Zhang | H01F 10/3259 257/E29.323 |
| 2013/0264665 A1 | 10/2013 | Jan et al. | |
| 2015/0333254 A1* | 11/2015 | Liu | G01R 33/098 438/3 |
| 2019/0288189 A1 | 9/2019 | Jan et al. | |

OTHER PUBLICATIONS

Free Online Dictionary, "Definition of tantalum," http:/encyclopedia2.thefreedictionary.com/Tantalum, retrieved from the Internet Jun. 18, 2013, 4 pages.

* cited by examiner

| # | FL | FL Cap | Cap | Anneal | RA_center |
|---|---|---|---|---|---|
| 1 | CFB10/Ta1.5/CFB10 | Mg4.5/Nox(18sccm,300s)/Mg2.5 | Ru | 300C-10min | 13.28 |
| 2 | CFB10/Ta1.5/CFB10 | Mg6/PT(15w,30s)/Nox(1sccm60s)Mg3 | Ru | 300C-10min | 7.15 |
| 3 | CFB10/Ta1.5/CFB10/PT(10w,30s) | Mg6/PT(15w,30s)/Nox(1sccm60s)Mg3 | Ru | 300C-10min | 5.71 |
| 4 | CFB10/Ta1.5/CFB10 | Mg4.5/Nox(18sccm,300s)/PT(35w,60s)/Mg3 | Ru | 300C-10min | 8.42 |
| 5 | CFB10/Ta1.5/CFB10/PT(10w,30s) | Mg4.5/Nox(18sccm,300s)/PT(35w,60s)/Mg3 | Ru | 300C-10min | 6.31 |

FIG. 6D

REDUCTION OF CAPPING LAYER RESISTANCE AREA PRODUCT FOR MAGNETIC DEVICE APPLICATIONS

PRIORITY DATA

The present application is a continuation application of U.S. patent application Ser. No. 16/429,163 filed on Jun. 3, 2019, which is a divisional application of U.S. patent application Ser. No. 13/441,158, filed Apr. 6, 2012, entitled "Reduction of Capping Layer Resistance Area Product for Magnetic Device Applications", which are herein incorporated by reference in their entirety.

RELATED PATENT APPLICATION

This application is related to Ser. No. 12/931,866, filing date Feb. 11, 2011 and to Ser. No. 13/068,172 filing date May 4, 2011, assigned to the same assignee as the current invention and fully incorporated herein by reference.

BACKGROUND

1. Technical Field

This disclosure relates generally to magnetic devices that utilize thin film magnetic layers with out-of-plane magnetic anisotropy, and more specifically, to methods for reducing the resistance-area product of individual layers without reducing the overall magnetoresistance of the device.

2. Description of the Related Art

Many present day magnetic devices utilize thin films with an "out-of-plane" (i.e., perpendicular to the film plane) magnetization direction, which is often referred to as perpendicular magnetic anisotropy (PMA). Such devices include, but are not limited to,
(1) various designs of magnetic random access memory (MRAM), e.g., PMA (or Partial-PMA) Spin-Torque MRAM in which such films can serve as pinned layers, reference layers, free layers, or dipole (offset-compensation) layers; (2) various designs of PMA spin valves, tunnel valves (magnetic tunnel junctions—MTJs) and PMA media used in magnetic sensors and magnetic data storage, and; (3) other Spintronic devices.

For these applications it is often important to employ PMA films with a large coercivity field, Hc, and anisotropy field, Hk. It is also important to reduce, as much as possible, the resistance-area product (RA) of the individual layers, high values of which reduce the overall magnetoresistance (MR) of the structure. A variety of methods have been employed to achieve this result, with various degrees of success. Examples can be found in:
U.S. Patent Application 2011/0086439 (Choi).
U.S. Pat. No. 7,750,421 (Horng et al.).
U.S. Pat. No. 7,602,033 (Zhao et al.).
U.S. Patent Application 2009/0162698 (Fukuzawa et al).

SUMMARY

A first object of the present disclosure is to provide such a reduction of the RA product of a thin-film magnetic device, while, at the same time, providing out-of-plane magnetic anisotropy to the magnetic layers.

A second object of the present disclosure is to provide such a PMA device with a high thermal stability.

A third object of the present disclosure is to provide such a PMA device where the free layer has enhanced values of Hc and Hk.

A fourth object of the present disclosure is to fulfill the previous objects while improving the design compatibility of the device and its method of fabrication with the design and fabrication requirements suitable for applications within the area of high-density, PMA spin-torque transfer MRAM.

The present disclosure achieves these objects by means of a capping layer and its method of formation. This capping layer, which is a thin, insulating layer of magnesium oxide (MgO), will provide out-of-plane anisotropy to the free layer (or other ferromagnetic layer) of a device on which it is formed. Note that the general effect of certain oxides in promoting vertical magnetic anisotropies of ferromagnetic thin films is described in related patent application HMG10-038, Ser. No. 12/931,866, which is fully incorporated herein by reference.

In addition, the present capping layer will provide high thermal stability, low resistance-area product (RA) and improved compatibility with the design and processing requirements of such magnetic devices. The method of this invention and the capping layer it produces is, therefore, highly suitable for applications in, e.g., the manufacture of high-density PMA Spin-Torque MRAM, and other spintronic based inventions as specified in the objects above.

According to the present method, the capping layer is a thin insulating magnesium oxide layer that will provide additional perpendicular anisotropy to the free layer. The capping layer is formed by the deposition and oxidation of a thin magnesium layer. Since this magnesium oxide layer contributes to the resistance of the stack, it reduces the overall MR of the structure.

A common approach to reducing RA of an oxide layer is to under-oxidize it. Unfortunately, the perpendicular anisotropy induced at the interface between the free layer and the capping layer is directly proportional to the oxidation state of the interface, which makes it difficult to reduce the RA of the oxide layer without also reducing Hk.

The present method provides a plasma treatment of a deposited (on a free layer) metallic magnesium layer before it is oxidized, which allows a reduction in the amount of oxygen necessary to oxidize the layer at the interface with the free layer. Therefore, the RA of the oxidized layer is reduced while preserving or even improving the induced perpendicular anisotropy of the free layer on which it is formed.

Plasma treatment can also be performed after the oxidation of the MgO, thus reducing the thickness of the oxide layer and also reducing the RA. Additionally, some plasma, treatment performed on top of the free layer also reduces the RA which is due, we believe, to the improved smoothness at the interface.

Typical previous methods of forming the oxidized cap layer produce a rough interface between the free layer and the oxide layer which allows oxygen to diffuse into the free layer. As illustrated schematically in the sequence FIGS. 1A-1D, the resulting oxidation profile (oxygen concentration as a function of penetration into a layer) is not abrupt at the interface.

FIG. 1A shows a schematic vertical cross-section of an Mg metal layer (10) deposited on a ferromagnetic material layer (20) (CoFeB, written as "CFB" in this and following figures). Note that the interface (23) is shown as a wavy line to indicate a non-smoothed surface.

After oxidation, as represented schematically by the arrows (30) in FIG. 1B, the Mg metallic layer has been converted into an oxidized Mg layer (40), denoted MgO hereinafter. A thin layer of oxidized CoFeB (50) (written as (CFB)Ox hereinafter) is also formed between interfaces (24) and (25) between the oxidized Mg and the unoxidized CoFeB (20).

The highly schematic graph in FIG. 1D shows a dashed line (100) representing the rather non-uniform oxygen concentration profile as measured downward from the MgO (40) surface being subjected to the oxidation process.

Finally, FIG. 1C shows the same layers of FIG. 1B subsequent to an annealing process that smooths the oxygen distribution (now shown as a solid line (110) in FIG. 1D) in the capping layer, leading to a somewhat flatter distribution. Yet, the oxidation of the cap layer (40) needs to be high in order to achieve PMA since it is mostly the oxygen concentration at the interface (24) with the free layer which determines the induced perpendicular anisotropy.

BRIEF DESCRIPTION OF THE DRAWINGS

FIG. 6D shows a table indicating the magnetic and resistive properties of several fabrications as a result of different capping formations and different plasma treatments.

DETAILED DESCRIPTION

Figure 1A:
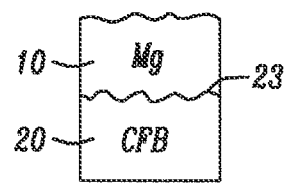
FIGS. 1A-1D are schematic illustrations, including a graph, of a prior art method of oxidizing a Mg layer, formed as a metal layer on a ferromagnetic layer, such that the oxygen concentration profile does not achieve the objects of the present invention.
Figure 1B:
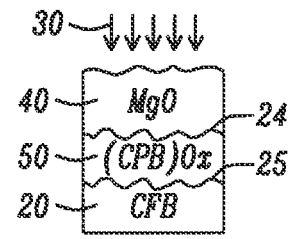
Figure 1C:
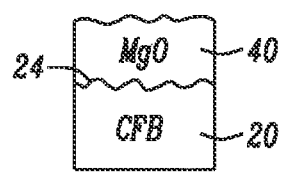
Figure 1D:
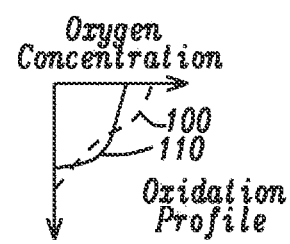

Preferred embodiments of the present disclosure provide a series of improvements over the previous method illustrated in FIGS. 1A-1C. The improvements will be seen in terms of an improved oxygen concentration profile of the MgO and (exemplary) CoFeB layers. It is noted that the process to be described herein could also be applied using oxides of elements chosen from the group consisting of Si, Ba, Ca, La, Mn, Zn, Hf, Ta, Ti, B, Cu, Cr, V and Al. In addition, the process to be described below could be carried out using nitrides of the same group of elements, if a nitride capping layer is to be used in place of an oxide layer.

Figure 2A:
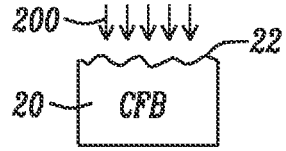
FIGS. 2A-2E schematically show an improved series of steps, according to an embodiment of the present invention, in which a ferromagnetic layer is smoothed by a plasma treatment before deposition of a metallic Mg layer, which is then oxidized.

Referring next to FIG. 2A, there is shown schematically a first aspect of a preferred embodiment of the present disclosure, which is to smooth the (exemplary) CoFeB free layer (20) surface (22) with a plasma treatment (as indicated schematically by the arrows (200)) before the metal deposition on that surface.

Figure 2B:
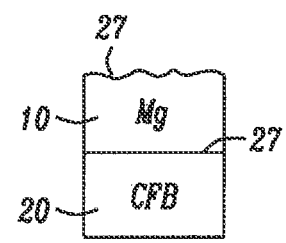

Referring next to FIG. 2B there is now shown, schematically, the deposition of a metallic layer of Mg (10) on the now smooth, interfacial surface (27). The resulting smooth interface (27) between the Mg layer and the exemplary CoFeB layer will be less prone to diffusion of oxygen, making the resulting oxidation profile more abrupt at the free layer/cap layer interface. The oxidation profile will be shown in the graph of FIG. 2E, discussed below.

Figure 2C:
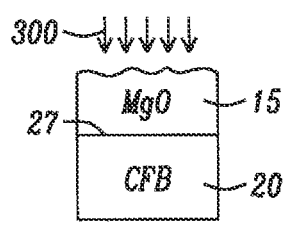

Referring next to FIG. 2C, there is shown an oxidation process (schematically represented by arrows (300)) applied to the Mg layer (10) to form a layer of MgO (15). The smooth interface (27), however, serves to act as a barrier to diffusion of the oxygen into the body of the CoFeB (written as CFB) free layer.

Figure 2D:
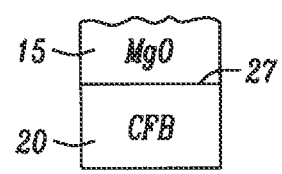

Referring next to FIG. 2D, there is shown the MgO layer (15) formed on the CoFeB layer after both the completion of the oxidation process in FIG. 2C of the Mg layer and the completion of an annealing process to improve the PMA properties of Hc and Hk.

Figure 2E:
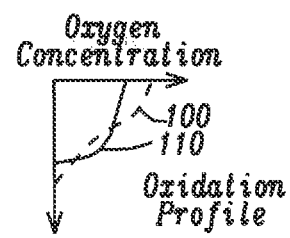

Referring finally to the graph in FIG. 2E, there are shown two oxygen concentration profiles. A dashed curve (100) represents the oxygen profile before the anneal referred to in FIG. 2D, while the solid curve (110) represents the oxygen concentration profile after the anneal. The more discontinuous nature (evidenced by a sharper reduction to zero concentration) of the after-anneal profile (110) at the interface would allow for higher interfacial anisotropy generated at the interface and lower RA contribution from the oxidized free layer. Still, a high oxidation of the cap layer is necessary to ensure good PMA.

The disclosed cap layer structure illustrated in these and the following figures (all of FIGS. 2, 3 and 4) can be deposited at room temperature or at elevated temperature (up to 400° C.). The additional annealing step (shown in FIG. 2D, FIG. 3E and FIG. 4E) of up to 400° C., with ~300° C. preferred, must be used to improve the PMA properties, such as increasing the Hc and Hk. The effect of the anneal is to produce the required anisotropy by modifying the interface between the ferromagnetic material and the oxide.

The most beneficial plasma treatment is made after the deposition of the metal cap layer, but before its oxidation, which will be shown in detail in FIGS. 4A-4F. This results in an improved oxidation of the interface between the free layer and the capping layer which increases the amount of induced perpendicular anisotropy at the free layer interface. A plasma treatment that achieves the objects of the disclosure and is used hereinafter, utilizes a radio-frequency generated plasma at low power (i.e., examples of between approximately 10 w and 35 w are described in FIG. 6) in the presence of an inert gas such as Ar, Kr or Xe.

The material of the cap layer can in theory be any oxide or nitride material which provides perpendicular anisotropy at the interface with the free layer which contributes to the RA of the full structure thus reducing the MR. Such materials include but are not restricted to: Al oxide, Mg/Ta Oxide, Ti oxide, Zn oxide, oxides of Si, Ba, Ca, La, Mn, Hf, B, Cu, Cr, V or native CFB oxide, or to nitrides of Mg, Si, Ba, Ca, La, Mn, Zn, Hf, Ta, Ti, B, Cu, Cr, V and Al.

Referring next to schematic FIGS. 3A-3F, there is shown schematically a second aspect of a preferred embodiment which provides a further improvement to the capping layer and enhances its effect on the free layer. This aspect of the disclosure is to etch back the formed oxide to remove the highly oxidized top portion of the MgO before anneal, as will be shown in FIG. 3D.

Figure 3A:
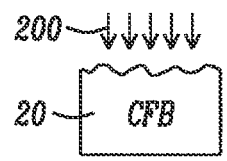
FIGS. 3A-3F schematically show additional improvement of the steps of FIGS. 2A-2E by adding a step of plasma treatment of the oxidized Mg layer.
Figure 3B:
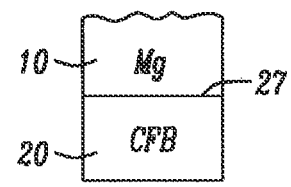
Figure 3C:
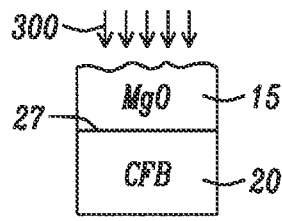

Referring first to FIGS. 3A-3C, there are shown the same steps as previously illustrated in FIGS. 2A-2C, during which a layer of metallic Mg (10) is deposited on a smooth CoFeB underlayer (20) and then oxidized (FIG. 3C (15)).

Figure 3D:
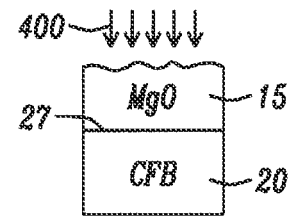
Figure 3E:
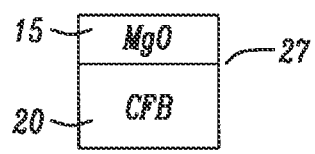
Figure 3F:
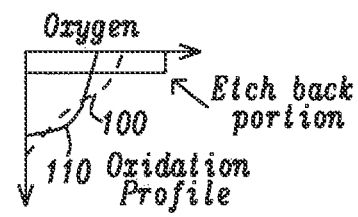

Referring now to FIG. 3D, there is shown an additional step in which a plasma treatment (arrows (400)) is applied to the upper surface of the MgO layer, which, before the plasma treatment, is both rough and over-oxidized. This plasma application removes (etches-back) an upper portion of the MgO layer, smoothing the surface of the remaining portion and thinning the remaining portion, while removing an over-oxidized portion. The reduced thickness of the remaining portion of the oxide layer and the removal of the over-oxidized portion helps in reducing the RA without sacrificing the PMA properties of the structure. Referring to the oxygen concentration profile of FIG. 3F, there is shown that the removal of the oxygen-rich upper portion of the MgO layer has truncated the oxygen concentration profile (110).

Referring now to schematic FIGS. 4A-4F, there is shown yet another aspect of the preferred embodiment in which the metallic Mg layer is treated with plasma before it is oxidized to both smooth the Mg layer and reduce its grain size.

Figure 4A:
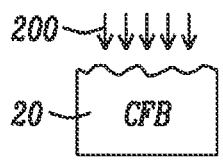
FIGS. 4A-4F schematically show additional improvement of the steps of FIGS. 3A-3F by adding a second step of plasma treatment to the ferromagnetic layer before formation of the oxidized Mg layer.

Referring first to FIG. 4A, there is shown the preliminary plasma treatment (arrows) (200) of the surface of the exemplary CoFeB layer, as also done in FIGS. 3A and 2A.

Figure 4B:
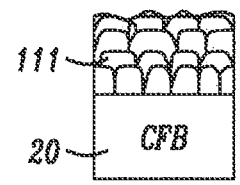

Referring next to FIG. 4B there is shown schematically the deposition of a metallic Mg layer (111), but the layer is now shown as a quasi-granular substance having large grains. This granular structure was also present in the deposited Mg layer of FIGS. 3B and 2B, but it was not shown there, as no further changes in grain size was to occur in the remainder of those processes.

Figure 4C:
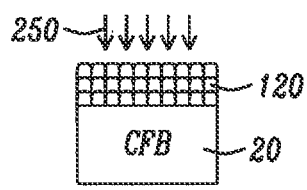

Referring next to schematic FIG. 4C, there is shown the effect of a plasma treatment (arrows (250)) on the grain size and thickness of the deposited Mg metallic layer (120). Specifically, the grain size is reduced and the metallic layer is smoothed, rendered more continuous in its internal structure and reduced in thickness.

Figure 4D:
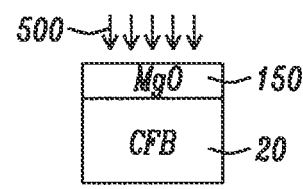

Referring next to FIG. 4D, there is shown an oxidation process (arrows (500)) applied to the metallic Mg layer of reduced grain size ((120) in FIG. 4C) to produce a layer of MgO (150). The reduced grain size renders this oxidation process more effective as the oxygen diffuses into the body of the layer with a greater uniformity of concentration.

Figure 4E:
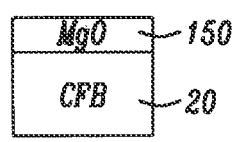

Finally, FIG. 4E shows the fabrication of FIG. 4D subsequent to an anneal as described in relation to the previous figures.

Figure 4F:
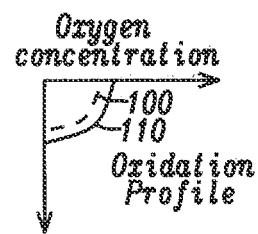

Referring now to the graph of oxygen concentration shown in FIG. 4F, there is shown the concentration profile both before the anneal (dashed curve (100)) and after the anneal (solid line curve (110)). These two curves, which are smooth and quite similar, illustrate that when a plasma treatment is performed on the metallic layer before oxidation (FIG. 4C) the resulting oxygen distribution profile is much improved as a result of more effective oxygen diffusion around the smaller grains of the metal. Thus, the effect of the plasma treatment is to both smooth and thin down the metallic layer and provide a smooth continuous metallic layer before oxidation. Another benefit is the reduction of the grain size. This reduction allows for more uniform oxidation of the metallic layer as the grain boundaries help the diffusion of the oxygen atom through the layer. For a given target oxidation of the interface, the oxidization step can be reduced greatly compared to the prior art.

We have also noted above that the process steps illustrated in FIGS. 4A-4E can be carried out using the native oxide of the ferromagnetic free layer, which here has been an exemplary layer of CoFeB (or another alloy of Co, Fe and B).

Figure 5A:
FIGS. 5A-5E describe a fabrication otherwise similar to FIGS. 3A-3F except a native oxide of the CoFeB free layer is used instead of an oxide of an Mg layer.

Referring now to the sequence of steps in FIGS. 5A-5D, the fabrication of FIG. 5A shows a layer of ferromagnetic material (20), such as the exemplary CoFeB (CFB), which is used as a free layer.

Figure 5B:
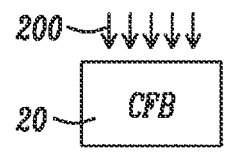

Referring to FIG. 5B, there is shown the CoFeB layer (20) being subjected to a plasma treatment (arrows (200)), which smooths the free layer and may also change the grain size of the free layer.

Figure 5C:
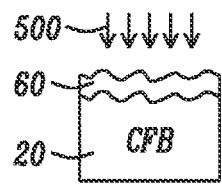

Referring next to FIG. 5C, there is shown the smoothed free layer of 5B now being subjected to an oxidation process (arrows (500)) which forms a native oxide layer (60) on the CoFeB layer.

Figure 5D:
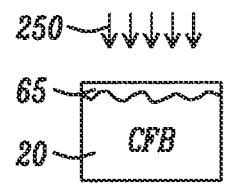
Figure 5E:
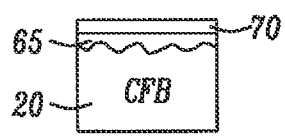

Referring next to FIG. 5D, there is shown the oxidized CoFeB layer being subjected to a second plasma treatment (arrows (250)), which smooths and reduces the thickness of the previously formed oxide layer (65). Finally, referring to FIG. 5E, there is shown the formation of an optional capping layer of metallic Mg (70) over the smoothed oxide layer (65).

Figure 6A:
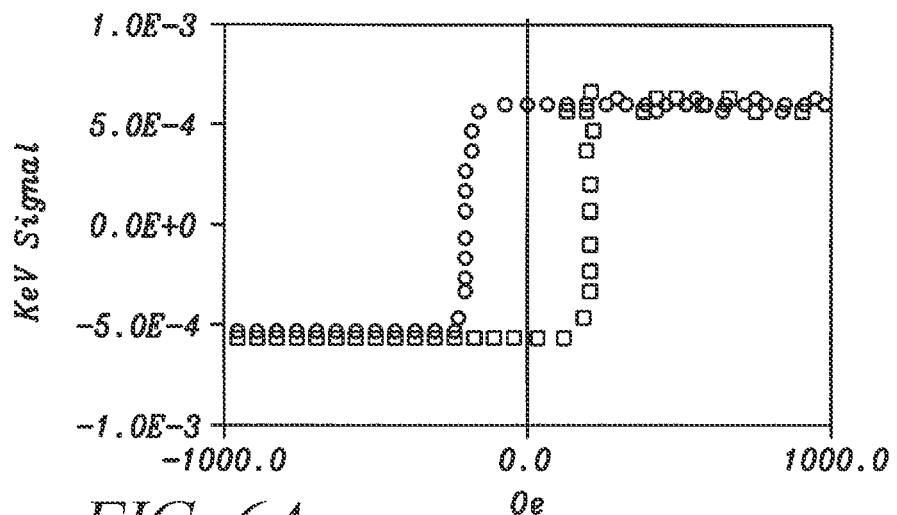
FIGS. 6A-6C each show an exemplary Polar Kerr hysteresis map corresponding, respectively, to a particular fabrication illustrated in rows 1, 3 and 4 of the table in FIG. 6D to verify that the fabrication has perpendicular magnetic anisotropy.
Figure 6B:
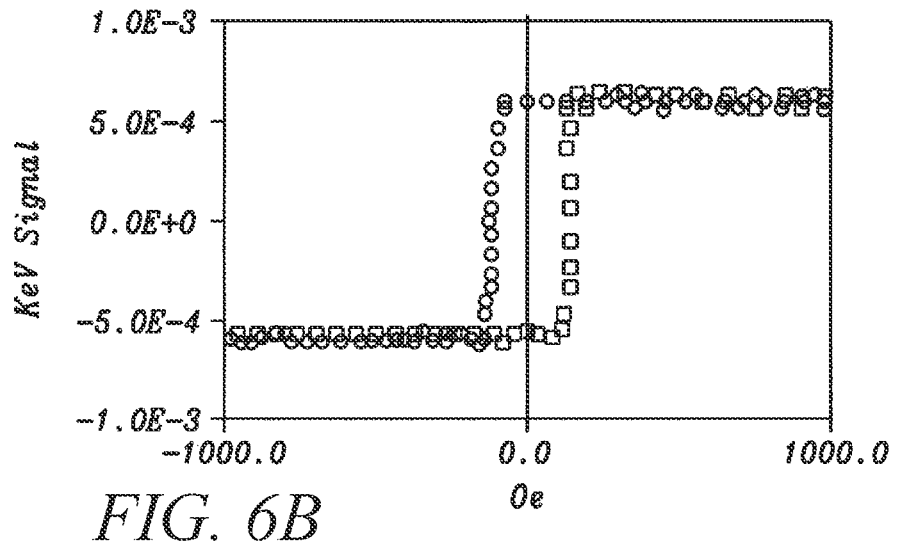
Figure 6C:
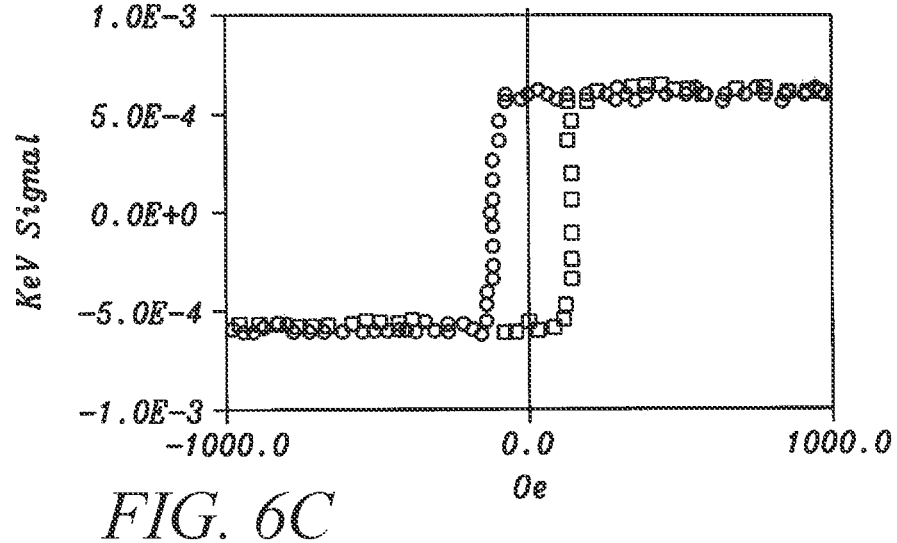

To illustrate the benefits of the different plasma treatment approaches, several exemplary structures have been built on an MgO barrier layer (i.e., a tunneling barrier layer such as might be found in an MTJ structure) as shown in the table of FIG. 6D. Polar Kerr maps of hysteresis curves displayed in FIGS. 6A-6C substantiate that the structures of rows 1 (6A), 3 (6B) and 4 (6C) are, indeed, PMA with enhanced properties that meet the objects of the disclosure. These particular structures could be used quite advantageously to form the free layer of an MTJ device in a spin torque transfer configuration.

Row #1 of the table in FIG. 6D shows (in column labeled FL) that a free layer is first formed as two layers of CoFeB of thickness 10 angstroms, separated by a Ta layer 1.5 angstroms in thickness. The column labeled "FL Cap" indicates the capping structure formed on the free layer as well as the particular oxidation and plasma treatments (PT, measured in watts, seconds) applied to that structure. The FL Cap of row 1 consists of a 4.5 angstrom thick layer of metallic Mg, oxidized by natural oxidation (Nox) using an oxygen flow rate of 18 sccm for 300 seconds, followed by a further deposition of 2.5 angstroms of Mg. A Ru capping layer is applied (column labeled Cap), followed by an anneal at 300° C. for 10 minutes (column labeled Anneal). The RA product is measured at the layer center as 13.28 ohm-micron$^2$.

The table of FIG. 6D also shows that applying a plasma treatment to the surface of the metallic Mg or to the surface of MgO (with slightly more power due to the lower etch rate of the MgO) is effective in reducing the R. It also shows that using a plasma treatment on top of the free layer also reduces RA.

In summary, the disclosed structure offers:
1. Improved PMA properties in a ferromagnetic layer in terms of its Hk and Hc,
2. Improved compatibility of such a layer and its fabrication method with high-temperature processing, and,
3. Improved RA.

These properties make the process and structure suitable for a variety of applications, particularly for use in advanced PMA Spin-Torque MRAM devices. The structure and process can also be utilized in those in-plane magnetic devices (i.e., whose magnetization is aligned in plane of the films) in which it is beneficial to introduce an out-of-plane component of magnetic anisotropy, such as in the In-Plane Spin Torque MRAM devices or Partial-PMA Spin Torque MRAM devices.

As is finally understood by a person skilled in the art, the preferred embodiments of the present disclosure are illustrative of the present disclosure rather than limiting of the present disclosure. Revisions and modifications may be made to methods, materials, structures and dimensions employed in forming and providing a capped ferromagnetic layer structure having a component of perpendicular-to-plane magnetic anisotropy enhanced and maintained by plasma treatments of the capped and capping layers, while still forming and providing such a structure and its method of formation in accord with the spirit and scope of the present invention as defined by the appended claims.

What is claimed is:

1. A method, comprising:
    providing a ferromagnetic layer having a surface;
    applying a first plasma treatment to the surface of the ferromagnetic layer to smooth the surface;
    performing an oxidation process to form an oxide layer on the plasma-treated surface of the ferromagnetic layer; and
    performing an annealing process, wherein a region between a surface of the oxide layer and the plasma-treated surface of the ferromagnetic layer is characterized by an oxygen concentration profile that approaches approximately zero at the plasma-treated surface of the ferromagnetic layer after the performing of the annealing process.

2. The method of claim 1, further comprising forming a metallic layer on the surface of the oxide layer prior to the performing of the annealing process.

3. The method of claim 1, further comprising etching the oxide layer to remove a portion of the oxide layer prior to the performing of the annealing process.

4. The method of claim 1, further comprising applying a second plasma treatment to the surface of the oxide layer to smooth the surface of the oxide layer prior to the performing of the annealing process.

5. The method of claim 4, wherein the applying of the second plasma treatment removes a portion of the oxide layer thereby reducing the thickness of the oxide layer.

6. The method of claim 1, wherein the performing of the oxidation process includes performing a native oxidation process.

7. The method of claim 1, further comprising forming a metal layer on the surface of the ferromagnetic layer prior to the performing of the annealing process, and
    wherein the performing of the oxidation process includes oxidizing the metal layer to form the oxide layer on the surface of the ferromagnetic layer.

8. A method comprising:
    providing a free layer and an oxide layer, wherein the oxide layer interfaces with the free layer; and
    annealing the oxide layer and the free layer to reduce an oxygen concentration profile to approximately zero at an interface between the oxide layer and the free layer.

9. The method of claim 8, wherein the oxide layer includes magnesium.

10. The method of claim 8, wherein the providing of the free layer and the oxide layer includes:
    forming a material layer directly on the free layer; and
    oxidizing the material layer to form the oxide layer.

11. The method of claim 8, further comprising removing a portion of the oxide layer prior to the annealing of the oxide layer and the free layer.

12. The method of claim 8, wherein the providing of the free layer and the oxide layer includes:
    applying a plasma treatment process on the free layer; and
    forming the oxide layer on the plasma treated free layer.

13. A method comprising:
    providing a ferromagnetic layer and an oxide layer, wherein the oxide layer interfaces with the ferromagnetic layer;
    annealing the oxide layer and the ferromagnetic layer to reduce an oxygen concentration profile to approximately zero at an interface between the oxide layer and the ferromagnetic layer; and
    removing a first portion of the oxide layer after the annealing of the oxide layer.

14. The method of claim 13, wherein the removing of the first portion of the oxide layer after the annealing of the oxide layer includes performing a plasma treatment process.

15. The method of claim 14, further comprising forming a metallic layer directly on a second portion of the oxide layer that remains after the removing of the first portion of the oxide layer.

16. The method of claim 13, wherein the oxide layer includes magnesium.

17. The method of claim 13, wherein the oxide layer includes a material selected from the group consisting of Si, Ba, Ca, La, Mn, Zn, Hf, Ta, Ti, B, Cu, Cr, V and Al.

18. The method of claim 13, wherein the ferromagnetic layer includes a material selected from the group consisting of Co, Fe, and B.

19. The method of claim 13, wherein the providing of the ferromagnetic layer and the oxide layer includes:
    applying a plasma treatment process on the ferromagnetic layer; and
    forming the oxide layer on the plasma treated ferromagnetic layer.

20. The method of claim 19, wherein the forming of the oxide layer on the plasma treated ferromagnetic layer includes:
    forming a material layer on the plasma treated ferromagnetic layer; and
    performing an oxidation process on the material layer to form the oxide layer.

* * * * *